(12) United States Patent
Kools (10) Patent No.: US 8,721,835 B2
(45) Date of Patent: May 13, 2014

(54) GAS INJECTION DEVICE WITH UNIFORM GAS VELOCITY

(75) Inventor: Jacques Constant Stefan Kools, Simiane Collongue (FR)

(73) Assignee: Koolerheadz, Simiane Collongue (FR)

( * ) Notice: Subject to any disclaimer, the term of this patent is extended or adjusted under 35 U.S.C. 154(b) by 38 days.

(21) Appl. No.: 13/638,047

(22) PCT Filed: Mar. 25, 2011

(86) PCT No.: PCT/IB2011/051273
§ 371 (c)(1),
(2), (4) Date: Sep. 28, 2012

(87) PCT Pub. No.: WO2011/121507
PCT Pub. Date: Oct. 6, 2011

(65) Prior Publication Data
US 2013/0019978 A1    Jan. 24, 2013

(30) Foreign Application Priority Data

Mar. 29, 2010 (FR) .................................... 10 01255
Mar. 29, 2010 (FR) .................................... 10 01257

(51) Int. Cl.
*H01L 21/306* (2006.01)
*C23C 16/455* (2006.01)

(52) U.S. Cl.
USPC .................. 156/345.34; 156/345.33; 188/715

(58) Field of Classification Search
CPC ............ H01J 37/3244; H01J 37/32449; H01J 37/32724; H01J 37/45595; C23C 16/45565; C23C 16/45561; C23C 16/4557; C23C 16/45544; C23C 16/45563; H01L 21/67303; H01L 21/67313; H01L 21/6735; H01L 23/02; H01L 23/13

USPC ......................... 156/345.33, 345.34; 118/715
See application file for complete search history.

(56) References Cited

U.S. PATENT DOCUMENTS 4,993,360 A * 2/1991 Nakamura .................... 118/719
5,077,875 A * 1/1992 Hoke et al. ................... 118/730
(Continued)

FOREIGN PATENT DOCUMENTS

DE   4107634 A1   9/1991
FR   2661554 A1   10/1991
(Continued)

OTHER PUBLICATIONS

Int'l Preliminary Report on Patentability issued Oct. 2, 2012 in Int'l Application No. PCT/IB2011/051273.
Int'l Search Report issued Jun. 1, 2011 in Int'l Application No. PCT/IB2011/051273; Written Opinion.

*Primary Examiner* — Jeffrie R Lund
*Assistant Examiner* — Satish Chandra
(74) *Attorney, Agent, or Firm* — Panitch Schwarze Belisario & Nadel LLP (57) ABSTRACT

Embodiments of the device relate to an injector (11) for injecting a gas in a processing chamber, including an inlet (21) for receiving a gas wave or a gas flow, a flow-shaping section (20) for expanding the gas in a direction (YY') perpendicular to a propagation axis (XX') of the gas, and an outlet (22) for expelling the gas. The flow-shaping section has first and second sidewalls (23) which diverge according to a divergence angle (A1) relative to the propagation axis of the gas, and includes means for slowing down the velocity of the gas near the center of the flow-shaping section, relative to the velocity of the gas near at least one sidewall.

12 Claims, 8 Drawing Sheets

(56) References Cited

U.S. PATENT DOCUMENTS

| | | |
|---|---|---|
| 6,544,869 B1 | 4/2003 | Harafuji et al. |
| 7,163,587 B2 | 1/2007 | Kinnard et al. |
| 2001/0032588 A1 | 10/2001 | Harafuji et al. |
| 2003/0150560 A1 | 8/2003 | Kinnard et al. |

FOREIGN PATENT DOCUMENTS

| | | |
|---|---|---|
| GB | 2177939 A | 2/1987 |
| GB | 2286856 A | 8/1995 |

* cited by examiner

GAS INJECTION DEVICE WITH UNIFORM GAS VELOCITY

CROSS-REFERENCE TO RELATED APPLICATIONS

This application is a Section 371 of International Application No. PCT/IB2011/051273, filed Mar. 25, 2011, which was published in the English language on Oct. 6, 2011, under International Publication No. WO 2011/121507 A1 and the disclosure of which is incorporated herein by reference.

BACKGROUND OF THE INVENTION

The present invention relates to a gas injection device and to a method for injecting a gas into a processing chamber. The present invention relates in particular to a method for injecting a gas into a processing chamber of a thin film reactor.

Figure 1A:
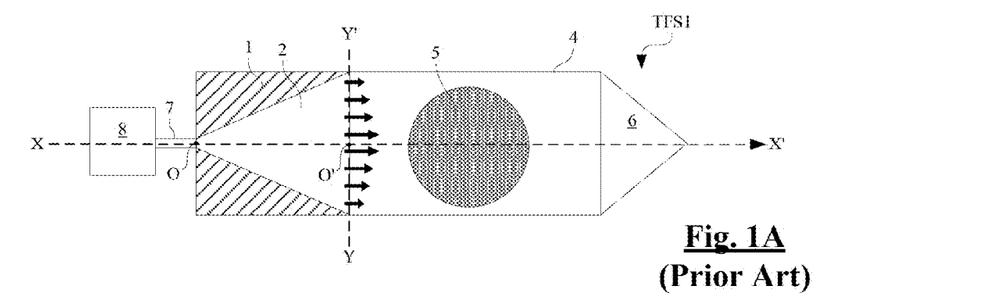
FIG. 1A, previously described, is a schematic top view of a conventional thin film deposition system.

Thin film deposition techniques, such as Physical Vapor Deposition (PVD) and Chemical Vapor Deposition (CVD), are techniques for depositing thin film layers upon a substrate, such as a semiconductor substrate. One particular CVD process subclass, called Atomic Layer Deposition ALD (also known as Atomic Layer Epitaxy ALE or Atomic Layer Chemical Vapor Deposition ALCVD), is used for semiconductor and thin film magnetic head manufacturing, and is being considered for the manufacturing of various new devices such as organic light emitting displays (OLED's) and photovoltaic elements. FIG. 1A shows a conventional thin film deposition system TFS1 comprising at least one injector 1 with a flow-shaping section 2, a processing chamber 4 wherein a substrate 5 may be placed, and an exhaust device 6. A gas tube 7 links the injector 1 to at least one source gas 8.

During a deposition process, a carrier gas comprising reactants is generally introduced into the injector 1 during a certain period of time, thereby forming a "gas wave" or "gas pulse". As described in U.S. Pat. No. 7,163,587, the flow-shaping section 2 of the injector may have a triangular shape with first and second sidewalls diverging according to a constant divergence angle relative to a propagation axis XX' of the gas wave inside the injector. The flow-shaping section 2 laterally expands the gas wave as it travels from a point O at the inlet of the flow-shaping section 2 until it reaches an outlet of the injector that opens onto the processing chamber 4. The gas is then expelled into the processing chamber 4, as shown by arrows in FIG. 1A, wherein reactants in the gas may react with the substrate surface 5 and/or with previously-deposited molecules. The processing chamber 4 may then be purged by injecting an inert gas that clears any excess reactants and products from the system, which are evacuated by means of the exhaust device 6. The pulsing/purging steps may then be repeated with a second gas from another gas source. Thin layers, for example between 0.1 and 3 Å, may be formed upon the substrate 5. This cycle is repeated as many times as necessary to obtain the desired thin film thickness.

Due to its layer-by-layer implementation, Atomic Layer Deposition allows for very high structural quality and thickness control of the thin film layers, as well as good step coverage over any features that may be present on the substrate. However, due to the required pulsing and purging steps, this process may take anywhere from several minutes to several hours, depending upon many factors such as the desired thin film thickness, reactants used, rapidity of the cycling, etc., resulting in a relatively low throughput. Recent research and development has focused on decreasing the deposition time of thin films in order to make this technique more attractive for large-scale production.

One common way to decrease the cycle time is to increase the gas flow rate. However, due to the Poiseuille effect, the triangular shape of the flow-shaping section causes the gas in the center of the injector to arrive at the outlet before the gas near the sidewalls. Thus, when such an injector is used in an application where a time-sequenced composition profile is created at the entrance, this peaked velocity distribution will result in a non-uniform gas composition distribution. Such a non-uniform gas distribution slows down the process by increasing the amount of time for a gas wave to travel through the processing chamber, as will be explained in relation with FIGS. 1B, 1C.

Figure 1B:
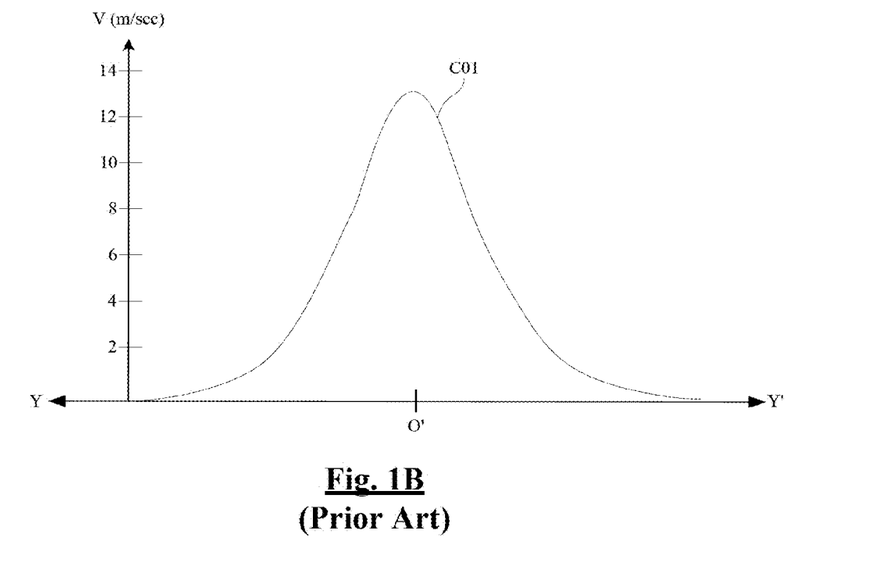
FIG. 1B, previously described, shows a velocity profile of a gas traveling through the system of FIG. 1A.
Figure 1C:
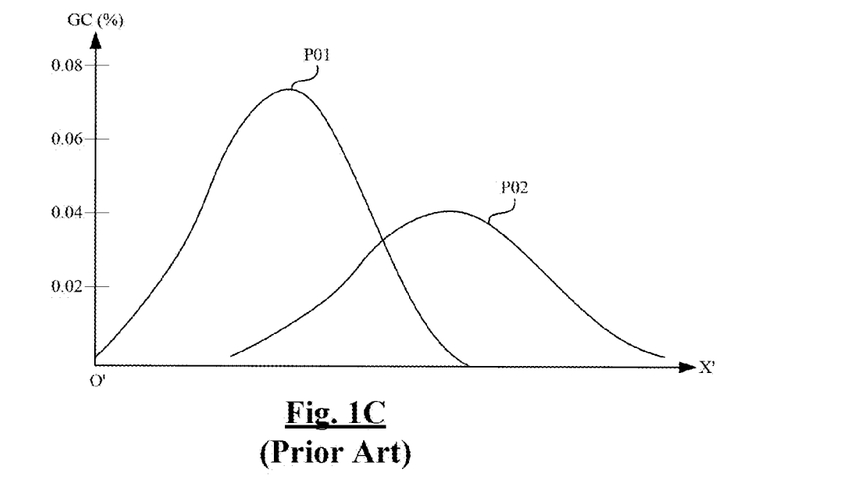
FIG. 1C, previously described, shows a concentration profile of a gas traveling through the system of FIG. 1A.

FIG. 1B shows the profile C01 of the gas velocity V at the outlet of the injector 1 of FIG. 1A. The gas velocity is measured along an axis YY' perpendicular to the gas propagation axis XX' and is expressed in meters per second. It can be seen that the gas velocity profile C01 has a peak value at a point O' at the center of the outlet of the injector, and quickly decreases when going away from point O', to reach 0 at the vicinity of the sidewalls of the injector. FIG. 1C shows two profiles P01, P02 of gas concentration GC along the propagation axis XX' through the processing chamber 4, from point O' at the outlet of the injector, at two different times after the injection of the gas wave. The gas concentration is expressed in percentage of the reactant present in the gas per unit of volume. It can be seen that, due to the diffusion of the reactant in the carrier gas, the length of the gas wave or gas pulse increases as it travels through the processing chamber.

In view of FIGS. 1B, 1C, it can be understood that a relation exists between the length of the gas wave P01 and the gas velocity profile C01, such that the more non-uniform the gas velocity profile along YY' at the outlet of the injector, the longer the time to expel the gas from the injector, the longer the profile of the gas wave along XX' that travels through the processing chamber, and the longer the time required between the injection of two successive gas pulses, since the slowest part of the gas wave must exit the chamber before the next wave is injected.

A non-uniform gas distribution may also cause deposition anomalies and uneven thin films. Therefore, it may be desirable to have as uniform a distribution of the gas across the surface of the substrate as possible. The gas wave should be optimized for the thin film deposition system and is highly dependent upon the physical properties of the injectors, dimensions of the processing chamber, substrate to be deposited upon, etc. As thin film deposition systems are typically used for electronic applications, they are therefore optimized for the standardized substrate dimensions often used in this industry, such as 150, 200, and 300 mm diameters. In order to apply these techniques to larger substrate sizes for other application domains, the dimensions of the injectors, gas inlets, processing chamber, exhaust device, etc. must be modified accordingly, complicating and increasing the cost of thin film deposition systems for large (500 mm or more) substrate sizes with fast cycling times. It is neither practical nor economical to develop a system for each possible processing combination, and current systems are not well-adapted for larger substrates, limiting their utility for other domains of application.

Furthermore, recent interest has arisen for the application of thin film deposition methods to other industries such as glass coating, display, and photovoltaics. These applications use much larger substrates, such as 1200 by 600 mm glass plates or a continuous roll of flexible material, requiring an increase in the amount of gas traveling through the injector, and a widening of the outlet of the injector. However, increasing the gas flow rate and widening the outlet of the injector cause turbulence and recirculation of the gas in the injector, resulting in an even more non-uniform distribution of the gas across the substrate surface and inefficient purging of precursors from the system.

BRIEF SUMMARY OF THE INVENTION

Embodiments of the present invention relate to an injector for injecting a gas in a processing chamber, comprising an inlet for receiving a gas wave or a gas flow, a flow-shaping section for expanding the gas in a direction perpendicular to a propagation axis of the gas, and an outlet for expelling the gas. The flow-shaping section has first and second sidewalls which diverge according to a divergence angle relative to the propagation axis of the gas, and comprises means for slowing down the velocity of the gas near the center of the flow-shaping section, relative to the velocity of the gas near at least one sidewall.

According to one embodiment, the flow-shaping section comprises a constriction region having a first height near the center of the flow-shaping section and a second height near at least one sidewall of the flow-shaping section, the first height being less than the second height to slow down the velocity of the gas near the center of the flow-shaping section relative to the velocity of the gas near said at least one sidewall.

According to one embodiment, the flow-shaping section comprises a first expansion region with a constant height followed by the constriction region.

According to one embodiment, the constriction region is followed by a further expansion region with a constant height less than the first height of the constriction region.

According to one embodiment, the flow-shaping section comprises a first expansion region where at least one sidewall diverges according to a first divergence angle, and a second expansion region including the constriction region, where at least one sidewall diverges according to a second divergence angle smaller than the first divergence angle, to accelerate the velocity of the gas near said at least one sidewall relative to the velocity of the gas near the center of the gas.

According to one embodiment, the first divergence angle varies and presents a largest value at the end of the first region, and the second divergence angle is constant and smaller than the largest value of the first divergence angle.

According to one embodiment, the flow-shaping section and constriction region are shaped so that the gas expelled through the outlet has a velocity profile showing a variation of less than 10% between maximum and minimum velocities, over at least 90% of the width of the outlet.

According to one embodiment, the injector has a curved flow-shaping section.

Embodiments of the invention also relate to a system comprising: a processing chamber; at least one injector according to the invention, the outlet of which opens into the processing chamber; and at least one gas source coupled to the inlet of the injector.

According to one embodiment, the system comprises two superposed injectors arranged one above the other and having a common outlet.

According to one embodiment, the system comprises at least two adjacent injectors forming an equivalent large injector having an equivalent large outlet including the outlets of the adjacent injectors and expanding the gas over the equivalent large outlet.

Embodiments of the invention also relate to a method for injecting a gas wave or a gas flow in a processing chamber, comprising: expanding the gas in a direction perpendicular to a propagation axis of the gas with an injector comprising an inlet, a flow-shaping section, and an outlet for expelling the gas; then injecting the gas into the processing chamber. Expanding the gas comprises slowing down the velocity of the gas near the center of the flow-shaping section of the injector relative to the velocity of the gas near at least one sidewall of the flow-shaping section, to control the velocity profile of the gas at the outlet of the injector.

According to one embodiment, the method comprises providing in the injector at least one constriction region having a first height near a center of the flow-shaping section and a second height near at least one sidewall of the flow-shaping section, the first height being less than the second height.

According to one embodiment, the method comprises: in a first region of the flow-shaping section, diverging the sidewalls of the flow-shaping section according to a first divergence angle; and in a second region of the flow-shaping section including the constriction region, diverging the sidewalls of the flow-shaping section according to a second divergence angle smaller than the first divergence angle, to accelerate the velocity of the gas near said at least one sidewall relative to the velocity of the gas near the center of the flow-shaping section.

According to one embodiment, the method comprises varying the first divergence angle so that it presents a largest value at the end of the first region, and keeping the second divergence angle constant and smaller than the largest value of the first divergence angle.

According to one embodiment, the method comprises slowing down the velocity of the gas near the center of the flow-shaping section so that the gas injected into the processing chamber has a velocity profile showing a variation of less than 10% between maximum and minimum velocities, over at least 90% of the width of the outlet.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 2A:
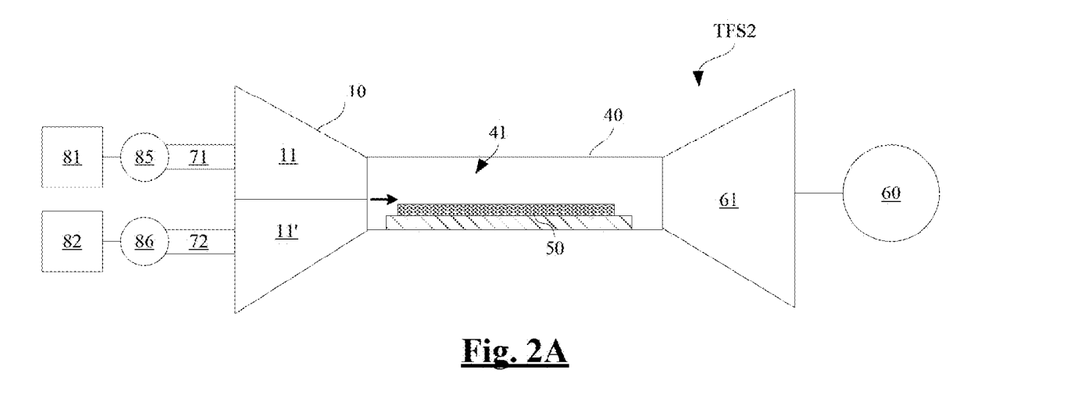
FIGS. 2A and 2B are schematic side and top views of a thin film deposition system according to a first aspect of the invention.
Figure 2B:
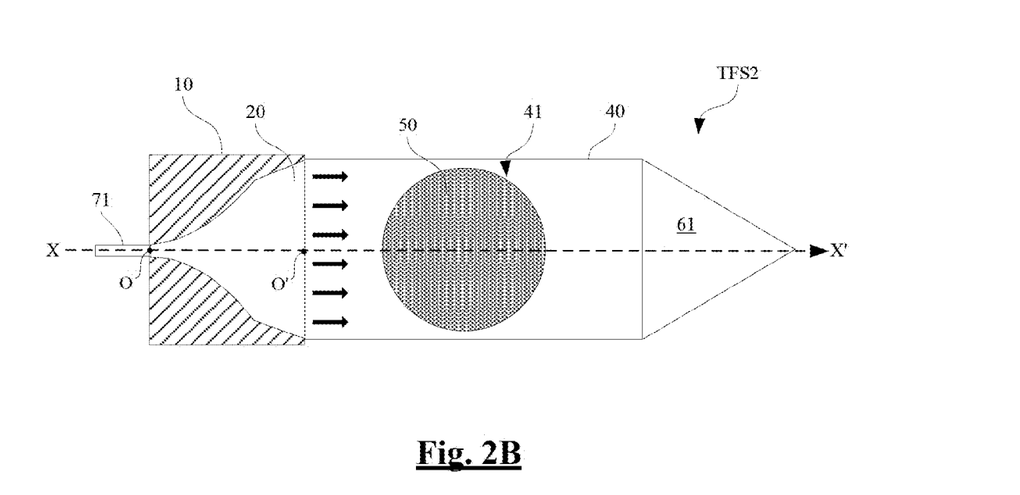

An embodiment of a thin film deposition system TFS2 according to a first aspect of the invention is schematically shown in FIG. 2A (side view) and FIG. 2B (top view). For the sake of clarity of the drawings, the elements are not necessarily shown to scale and the drawings do not necessarily show every aspect of the system.

The system TFS2 is designed for Atomic Layer Deposition applications and comprises an injector assembly 10 having two injectors 11, 11', a base unit 40, and an exhaust device 61. The base unit 40 comprises a processing chamber 41 receiving a substrate 50, which may be mounted on a support. Each injector 11, 11' has a gas admission inlet linked to a gas source 81, 82 through a gas tube 71, 72 and a valve 85, 86. The base unit 40 may be made out of metal, such as aluminum or stainless steel, and may comprise further components such as to create a vacuum, heat the processing chamber and/or the substrate, openings to allow the introduction and removal of the substrate, cleaning, alignment of the base unit with other components, etc.

A first gas wave is introduced into the injector 11 and propagates along a propagation axis XX' through the injector 11, wherein it is expanded laterally, i.e. along an axis Y4Y4' perpendicular to the propagation axis XX' before being expelled into the processing chamber 41. In the processing chamber, the first gas wave travels across the surface of the substrate 50 in a wave that is substantially parallel to the surface of the substrate, and reacts with the substrate before being purged from the chamber by means of the exhaust device, which is linked to a pump 60.

A second gas wave is then introduced into the injector 11' and propagates along the propagation axis XX' through the injector 11', wherein it is laterally expanded along the axis Y4Y4' before being expelled into the processing chamber 41. In the processing chamber, the second gas wave travels across the surface of the substrate 50 in a wave that is substantially parallel to the surface of the substrate, and reacts with deposits left by the first gas injection.

As an example, to obtain an $Al_2O_3$ film a first gas comprising aluminum, such as trimethyl aluminum (TMA) or aluminum chloride ($AlCl_3$), is pulsed into the processing chamber through the first injector where it reacts with the substrate, then the first gas is purged from the chamber by means of the exhaust device while injecting an inert gas, such as nitrogen $N_2$ or argon Ar, in the chamber through the first injector. Then a second gas comprising oxygen, such as water vapor $H_2O$ or ozone $O_3$, is pulsed in the chamber through the second injector, and the oxygen reacts with the aluminum, forming a monolayer of $Al_2O_3$ film. The chamber is then purged again with an inert gas, and the cycle is repeated.

Figure 3:
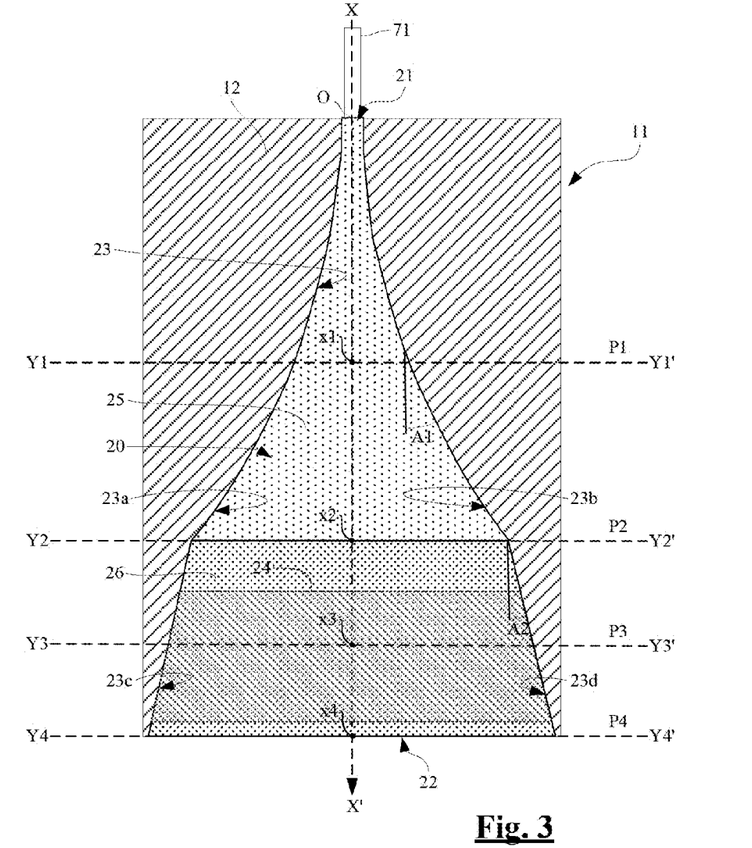
FIG. 3 is a top view of a first embodiment of an injector of the system of FIGS. 2A, 2B.

FIG. 3 is a top view showing in further detail the structure of the injector 11 according to a first embodiment of the invention. It is assumed in this embodiment that both injectors 11, 11' have the same structure, therefore only injector 11 will be described. However, other embodiments may be provided in which injectors 11, 11' have different structures, for example depending on the nature of the gas they are intended to inject.

The injector 11 comprises a body 12 and a flow-shaping section 20. The flow-shaping section 20 may be a cavity milled out of the body 12, which may be for example a metal plate, such as aluminum or stainless steel. The cavity may be formed by precise milling of the metal plate. A cover device 13 (not shown in FIG. 3) may be attached to the body 12 by welding, brazing, or simply mounted thereupon with screws, pins, and the like.

The flow-shaping section 20 comprises an inlet 21 and an outlet 22. The inlet 21 is connected to the gas tube 71 and has the shape of a small opening. The outlet 22 has the shape of a larger opening and opens onto the processing chamber, for expelling the gas thereunto. The flow-shaping section comprises right and left sidewalls 23, a bottom surface, and a top surface formed for example by the above-mentioned cover device. The bottom and top surfaces are substantially parallel except in a region described below. The sidewalls 23 diverge outwardly from the inlet 21 to the outlet 22, expanding the gas wave in a direction perpendicular to a propagation axis XX' of the gas wave.

The flow-shaping section 20 further comprises a constriction region 24 to shape the gas velocity profile as desired. As will be explained in further detail below, the height of the flow-shaping section 20 in the constriction region 24 varies so as to standardize the velocity of the gas wave across the lateral expansion width of the gas wave expelled into the processing chamber 41. The injector 11 therefore expands the gas wave along axes Y1Y1', Y2Y2', Y3Y3', Y4Y4' perpendicular to the propagation axis XX', while adjusting the velocity of the gas across the lateral expansion width. In particular, and as shown in FIG. 4C, the constriction region may comprise a reduced height h2 in the vicinity of the propagation axis and a greater height h3 near the sidewalls 23, to slow down the velocity of the gas near the center of the flow-shaping section relative to its velocity near the sidewalls.

In the embodiment shown in FIG. 3, the flow-shaping section further comprises a first expansion region 25 that performs only lateral expansion and a second expansion region 26 that includes the constriction region 24 and performs lateral expansion and vertical constriction (regions 25, 26 are shown by different shadings).

The first expansion region 25 extends from the inlet 21 to a transition point X2, and the second expansion region 26 extends from point X2 to the outlet 22. The first and second expansion regions may be two different pieces joined together, or may simply be different regions of a same piece.

The first expansion region 25 comprises left sidewall 23a and right sidewall 23b, and the second expansion region 26 comprises left sidewall 23c and right sidewall 23d. The sidewalls 23a, 23b of the first expansion region 25 diverge according to a divergence angle A1 relative to the propagation axis XX' of the gas wave, whereas the sidewalls 23c, 23d of the second expansion region 26 diverge according to a divergence angle A2 relative to the propagation axis XX'. In one embodiment, the divergence angle A1 is greater than the divergence angle A2, so that the second expansion region 26, all while performing an overall lateral expansion of the gas wave, also performs an additional constrictor function near the sidewalls, to further decrease the velocity of the gas near the center relative to its velocity near the sidewalls of the second expansion region 26.

In one embodiment, the divergence angle A1 varies and increases as the distance from the inlet 21 increases, to reach a maximum value A1max at the end of the first expansion region 25, while the divergence angle A2 is constant, A1max being greater than A2. Preferably, the divergence angle A1 varies according a supralinear function, such as a quadratic or exponential function. A supralinear lateral expansion helps to suppress turbulence near the inlet 21 of the injector 11, where the velocity of the gas is the highest. In the embodiment shown in FIG. 3, the sidewalls 23a, 23b of the first expansion region 25 diverge exponentially whereas the sidewalls 23c, 23d of the second expansion region 26 diverge linearly with the constant angle A2.

FIGS. 4A, 4B, 4C, 4D are cross-sectional views of the injector of FIG. 3 along different cross-sectional planes, respectively P1, P2, P3, P4, which are perpendicular to the propagation axis XX'. Plane P1 passes though a point X1 of the axis XX', point X1 being at a distance d1 from a reference point O at the inlet 21. Plane P2 passes though a point X2 of the axis XX', point X2 at a distance d2 from point O, d2 being greater than d1 and equal to the length of the first expansion region 25. Plane P3 passes though a point X3 of the axis XX', point X3 at a distance d3 from point O, d3 being greater than d2 and corresponding substantially to the midpoint of the constriction region 24. Plane P4 passes though a point X4 on the axis XX', point X4 being at a distance d4 from point O, d4 being greater than d3 and equal to the length of the flow-shaping section 20, so that plane P4 includes the outlet 22 of the injector. In FIG. 3, the propagation axis XX' and a longitudinal axis of symmetry of the injector are one and the same, so that points X1, X2, X3, X4 are each equidistant from the right and left sidewalls of the flow-shaping section 20.

Figure 4A:
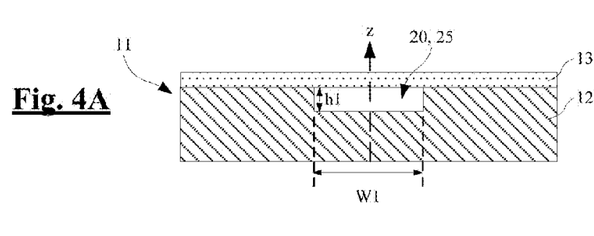
FIGS. 4A, 4B, 4C, 4D are cross-sectional views of the injector of FIG. 3 along different cross-sectional planes.

In FIG. 4A, the cross-section of the first expansion region 25 of the flow-shaping section 20 has a substantially rectangular shape, with a width W1 and a height h1. The height h1 is the distance between the bottom surface and the top surface of the flow-shaping section 20, the top surface being formed here by a lower face of the cover 13.

Figure 4B:
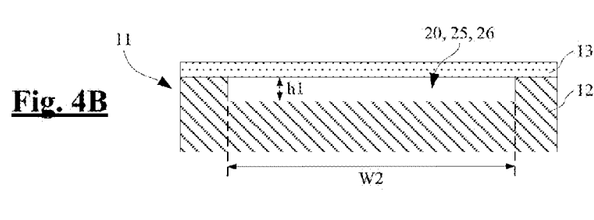
Figure 4C:
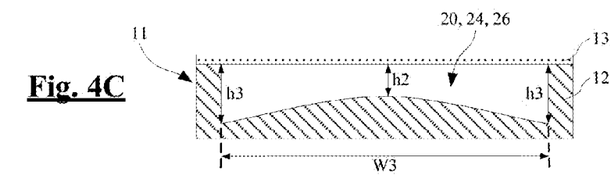

In FIG. 4B, the cross-section of the flow-shaping section 20, at the limit between first and second expansion regions 25, 26, has a substantially rectangular shape with a width W2>W1 and a height h1 equal to that of FIG. 4A.

In FIG. 4C, the cross-section of the flow-shaping section 20, in the constriction region 24 located within the second expansion region 26, has a width W3>W2, a flat top surface and a substantially convex bottom surface. Therefore, it presents a first height h2 in the middle of region 26 (i.e. near point X3) and a second height h3 near the sidewalls, h3 being here greater than h2 so as to reduce the gas velocity in the center of the second expansion region relative to the gas velocity near the sidewalls. In one embodiment, the shape of the convex bottom surface along axis Y3Y3' is defined according to a Bezier curve. In this embodiment, h2 is greater than h1 but may be equal to or less than to h1 in other embodiments.

Figure 4D:
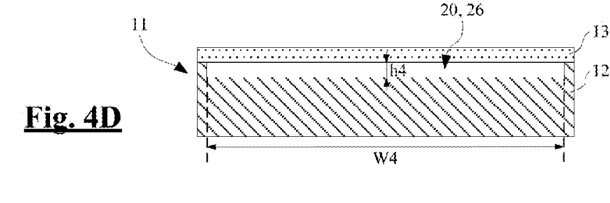

In FIG. 4D, the cross-section of the flow-shaping section 20, at the vicinity of the outlet 22, has a substantially rectangular shape with a width W4>W3 and a height h4 less than h3 and also less than h1. In other embodiments, h4 may be greater than h1 and less than h2.

In one embodiment, the bottom surface of the second expansion region 26 comprises two non-uniform rational basis spline surfaces (NURBS), one in the area between axes Y2Y2' and Y3Y3', and another in the area between axes Y3Y3' and Y4Y4'.

FIGS. 5A, 5B, 5C, 5D show different profiles C1, C2, C3, C4 of the velocity V of a gas wave traveling through the injector, measured along different axes Y1Y1', Y2Y2', Y3Y3', Y4Y4' perpendicular to the propagation axis XX' and respectively included in planes P1, P2, P3, P4. A Computational Fluid Dynamics (CFD) analysis on a three-dimensional discretized model of the injector geometry using the finite volume method may be used to obtain such profiles.

Figure 5A:
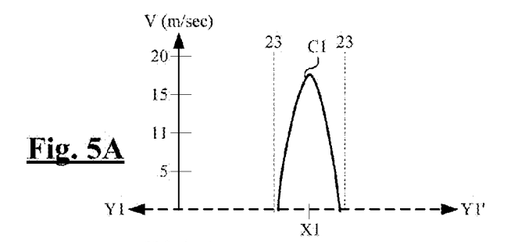
FIGS. 5A, 5B, 5C, 5D show different velocity profiles of a gas traveling through the injector of FIG. 3, at different points of the injector.
Figure 5B:
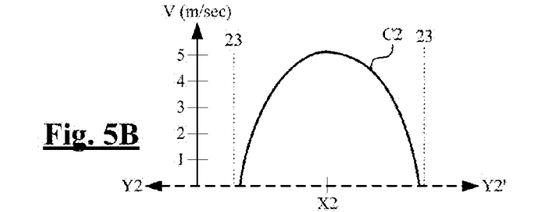
Figure 5C:
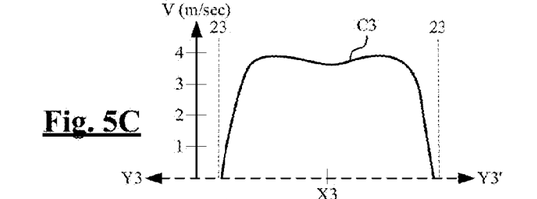
Figure 5D:
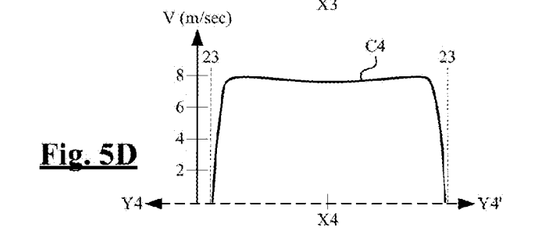

It can be seen that:

In FIG. 5A, profile C1 is strongly peaked around the central point X1 of the flow-shaping section 20 and shows a high velocity (for example 17m/s) at this point, then quickly decreases when going away from point X1 to reach a velocity of 0 m/s at the vicinity of the sidewalls 23 (the velocity of a gas traveling though a pipe being always being equal to 0 right next to the walls of the pipe);

In FIG. 5B, profile C2 is less but still peaked around central point X2, shows a lower velocity (for example 5m/s) at point X2, then decreases less quickly than profile C1 when going away from the central point X2, to reach a velocity of 0 m/s at the vicinity of the sidewalls 23;

In FIG. 5C, it can be seen that the correction of the velocity dispersion between the center of the injector and the sidewalls has begun. Profile C3 is no longer peaked around the central point X3, and presents a rather flat profile with abrupt slopes in the vicinity of the sidewalls 23. The larger height h3 causes reduced flow resistance near the sidewalls, guiding the gas towards the edges. As a result, the gas has a higher velocity, about 10%, near the edges than in the center. Thus, profile C3 shows a slight "dip" in the vicinity of the central point S3 and two "bumps" on either side of the dip;

In FIG. 5D, profile C4 is substantially uniform across the majority of the outlet 22 and decreases abruptly to a velocity of 0 m/s in the vicinity of the sidewalls 23.

Therefore, the different heights h1, h2, h3, h4 of the injector can be adjusted to tune as desired the velocity profile of the gas expelled into the processing chamber.

In applications where a uniform velocity profile is sought at the outlet of the injector, the present invention allows a velocity dispersion less than 10% between maximum and minimum velocities over at least 90% of the width of the outlet to be obtained. Generally speaking, the velocity dispersion at the outlet 22 of the injector depends not only on the difference between h1, h2, h3, h4, but also on the difference between the maximum divergence angle A1 of the first expansion region 25 and divergence angle A2 of the second expansion region 26, and on the initial velocity of the gas at the inlet 21, as will now be seen in reference to FIG. 6.

Figure 6:
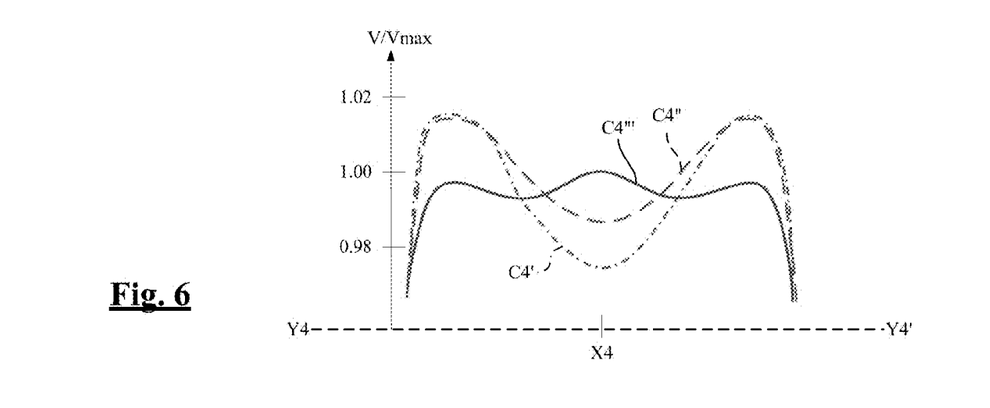
FIG. 6 shows variations of a velocity profile of a gas at an outlet of the injector of FIG. 3, for different inlet velocities of the gas.

FIG. 6 shows the effect of the inlet gas speed upon gas velocity profile on outlet of the injector 11, along axis Y4Y4'. The gas velocity is expressed here as a ratio between the velocity of the gas along axis Y4Y4' and its maximum velocity. In this example, the first expansion region 25 has a width W2 of 10 cm, a length d2 of 7.5 cm, and a divergence angle A1 varying exponentially. The constriction region 26 has a height h3=0.5*h2. Three profiles C4', C4", C4'" are shown, corresponding to inlet velocities at the inlet 21 of 10 m/s, 40 m/s, 70 m/s respectively. Profiles C4' and C4" have two lateral "bumps" and one central "dip", and therefore show one lowest velocity point near the central point X4 and two highest points near the sidewalls. Profile C4'" has three "bumps" and two "dips", and has therefore one central maximal velocity point and two lateral maximal velocity points, and two lowest velocity points between the maximal velocity points. It is to be noted that these velocity profile features are shown in an expanded view and are, in practice, relatively small. For example, for the profile C4''', the difference between the "bump" and the "dip" represents a variation of less than 1% of the velocity of the gas, which is therefore substantially uniform over most of the width of the outlet of the injector.

These profiles exhibit that for a determined shape of the expansions regions 25, 26 and constriction region 24, a critical velocity VC exists. The injector has a different behavior depending on whether the inlet gas velocity (velocity of the gas at the inlet of the injector) is below or above the critical velocity VC. Below the critical velocity, there is no turbulence and recirculation in the first expansion region 25; the velocity profile is substantially constant and independent of the inlet velocity. Above the critical velocity, a recirculation pattern occurs in the first expansion region 25, and the outlet velocity profile changes with the inlet velocity, causing changes in the uniformity of the velocity profile. The velocity VC value depends on the geometry: a short and/or wide first expansion region 25 has a lower VC, which means that recirculation or turbulence occur at a lower input velocity compared to a longer and/or narrower expansion region. Therefore, there exists an approximate scaling relationship of the type VC=f (d2/W2).

The outlet velocity profile can be tuned by adjusting the height h2 of the constrictor at point X2. The required correction depends on the first expansion region 25 length and the desired operating point. A method of designing the injector may consist in slightly overcompensating the velocity near the sidewalls so that it can have its most uniform velocity profile at the highest allowable inlet velocity before the critical velocity is reached.

Generally speaking, it is within the capabilities of the skilled person to adjust the properties of the injector, for example by adjusting the different heights h1, h2 h3, h4 in order to obtain the desired gas profile in relation with a considered application. The height h1 may be chosen to approximately match the diameter of the inlet gas tube, which may have a standardized diameter of approximately 6 mm or approximately 12 mm in some applications. If a height h1 value is chosen that is significantly different from the inlet diameter, a step in the flow path may be created, causing recirculation or turbulence. The height h4 may be relatively small, such as 1-2 mm in some applications, and may be limited by the manufacturing process. A small height h4 value may help to prevent a "backflow" of gas from another injector if there is more than one injector.

Figure 7:
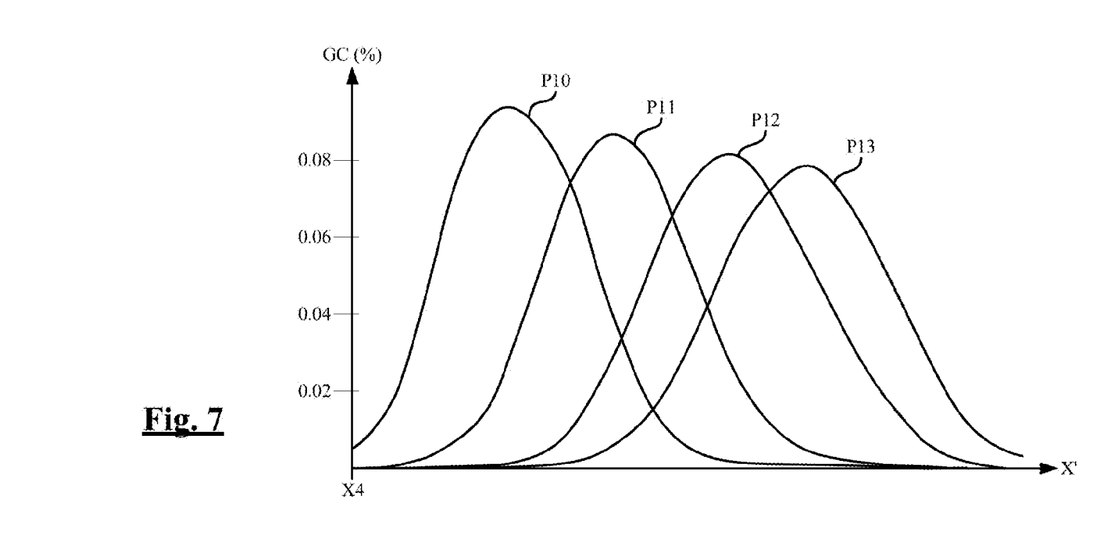
FIG. 7 shows different concentration profiles of a gas traveling through the system of FIGS. 2A, 2B.

FIG. 7 shows profiles P10, P11, P12, P13 of gas concentration GC along the propagation axis XX' through the processing chamber 41, from point X4 at the outlet of the injector (Cf. FIG. 3), at four different times after the injection of the gas wave into the injector, respectively 80 ms, 100 ms, 120 ms, and 140 ms. The gas concentration is expressed in percentage of the reactant present in the gas per unit of volume (for example TMA or oxygen). As the gas wave travels through the processing chamber it remains very uniform, without losing much of its height or becoming very dispersed. This is due to the initial uniformity of the gas velocity profile at the outlet of the injector. The pulse width of the traveling wave increases slowly, with a small difference between the values near the sidewalls as compared to the values near the center of the injector. It has been observed that the thin film deposition system is ready to begin to the next cycle after about half of the processing chamber has been purged, contrary to a conventional system such as that described in U.S. Pat. No. 7,404,984, in which a purge pulse of at least twice of the volume of the processing chamber must have been injected before starting the next cycle. As a result, the monitoring of the velocity profile, thanks to the structure of injector according to the invention, allows the rate of the pulsing and purging cycles to be increased.

Figure 8:
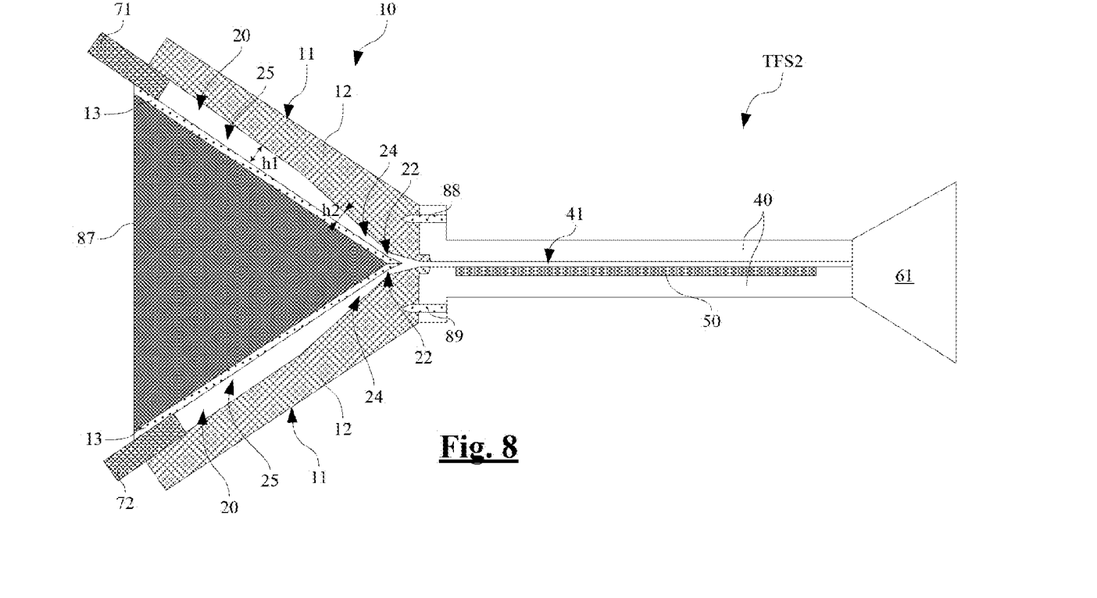
FIG. 8 is a cross-sectional view of an injector assembly of the system of FIGS. 2A, 2B.

FIG. 8 is a cross-sectional view of an embodiment of the thin film deposition system TFS2 of FIGS. 2A, 2B, showing how two injectors 11, 11' can be assembled to form the injector assembly 10. As previously described, each injector 11, 11' comprises a machined body 12 in which the different regions 24, 25, 26 of the flow-shaping section 20 have been formed, and a cover 13. A divider block 87 is placed between the injectors 11, 11' for physical support. Each injector is arranged on the divider block 87 so that its cover 13 is against the divider block. Seen in cross-section, the divider block has a triangular shape so that the injectors 11, 11' are oriented with respect to each other with a certain angle, for example about 60°, and so that their outlets 22 join together to form a common outlet. The common outlet is formed by an area where their respective bodies 12 are not covered by the cover 13 and are opposite one another. The injectors 11, 11' are attached to and aligned with the base unit 40 by means of alignment devices 88, 89, such as pins. Each injector 11, 11' is connected on inlet to one gas tube 71, 72 respectively, linked to one or more gas sources (not shown).

In an alternative embodiment (not shown), the injectors may not comprise cover devices. The divider block 87 itself may form the top surfaces of each injector.

Figure 9:
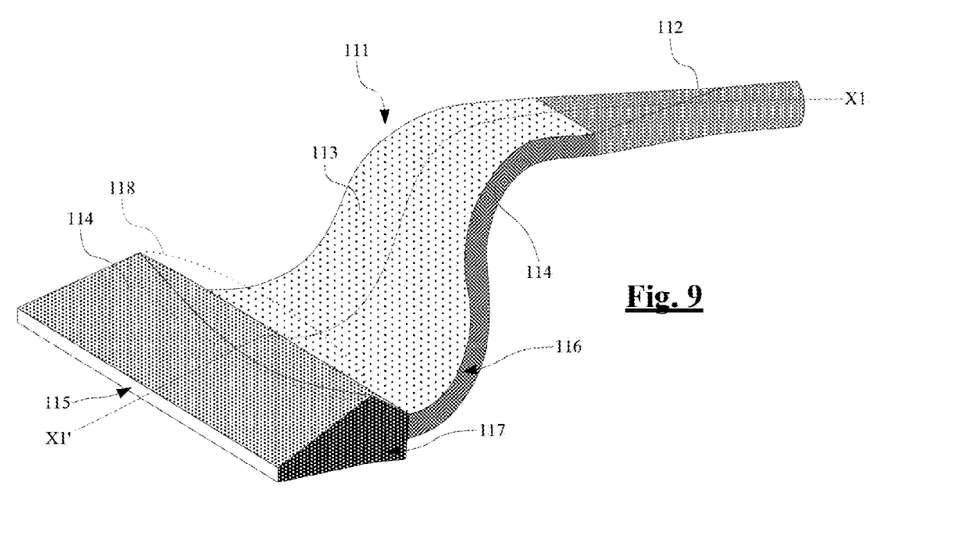
FIG. 9 is a perspective view of a second embodiment of an injector of the system of FIGS. 2A, 2B.

FIG. 9 shows an alternative embodiment of an injector 111 according to the invention. The injector 111 comprises an inlet 112, followed by a first flow-shaping section 113, itself followed by a second flow-shaping section 114, and an outlet 115 at the end of the second flow-shaping section 114. The first flow-shaping section 113 has a curved shape, approximately in an "S" shape. It also has sidewalls 116 which diverge according to a first divergence angle A1, preferably a variable angle increasing according to a quadratic or exponential function. Therefore, the first flow-shaping section 113 forms an expander device corresponding to the first expansion region previously described. A propagation axis X1X1' of the gas has here a curved shape since the gas travels through the curved flow-shaping section 113.

The second flow-shaping section 114 has sidewalls 117 and a constriction region 118 in which its height varies along an axis perpendicular to the gas propagation axis X1X1', with a height near its center less than the height near the sidewalls 117. In one embodiment, the sidewalls 117 are diverging according to an angle A2 and the second flow-shaping section 114 corresponds to the second expansion region previously described, which includes the constriction region. In another embodiment, the second flow-shaping section 114 has parallel sidewalls 117 and forms a constrictor device for the gas wave expelled by the first flow-shaping section 113, without further lateral expansion of the gas.

It will be noted that various other embodiments and applications of an injector according to the invention may be provided by the skilled person. The constriction region may have different shapes and may for example be obtained by variations of both bottom and top inner surfaces of the flow-shaping section. The constriction region may also be implemented using a diffuser plate of the type described later in connection with FIGS. 12A, 12B, comprising openings being sized and/or spaced from each other so that the center of the gas wave is slowed down with respect to its sides in the constriction region.

In addition, despite that it has indicated above that the system TFS2 is designed for Atomic Layer Deposition wherein gas waves (or gas pulses) are injected into the processing chamber, embodiments of an injector according to the invention may also be used for other methods of and systems for depositing materials, such as Chemical Vapor Deposition CVD, Physical Vapor Deposition PVD, Molecular Beam Epitaxy MBE, plasma-enhanced chemical vapor deposition PECVD, and in general any method wherein a gas travels through an injector and into a processing chamber.

Also, the use of the term "substrate" in the present description should be taken to mean any type of material upon the surface of which a chemical reaction may take place in order that thin film layers may be formed. These substrates may be of semiconductor material, plastic, metal, glass, optoelectronic devices, flat panel displays, liquid crystal displays, etc. and may be of diverse sizes, shapes, and formats.

Equally, embodiments of an injector according to the invention may also be used to expand a continuous gas flow instead of shaping a gas wave. Such embodiments may help to improve a thin film deposition process by homogenizing the quantity of reactant deposited by the gas over the entire processed surface, and consequently make the thickness of the deposited thin film more uniform.

Also, a thin film deposition system according to the invention may comprise a single injector instead of an injector assembly comprising two or more injectors according to the invention.

In addition, embodiments of an injector according to the invention are not only destined to make the gas velocity profile uniform at the outlet of the injector. In other applications, it may be on the contrary desired that the velocity of the gas near the sidewalls is different than the velocity of the gas the center of the outlet, and in particular it may be desired to obtain a greater velocity of the gas near the sidewalls relative to the velocity near the center of the outlet, as will now be seen in connection with the description of a second aspect of the invention.

As indicated above, the application of thin film deposition techniques for processing substrates (500 mm or more) larger than conventional semiconductor substrates, requires that the dimensions of the injectors, the processing chamber, the exhaust device, etc. be modified accordingly. In such applications, it may be desired to provide a thin film deposition system adapted for large substrates.

In such case, it may be desired to have injectors with a large outlet. However, it has been found that it becomes more and more difficult to control the gas velocity profile at the outlet of an injector as it becomes wider, i.e. as the ratio between the width of the outlet and the width of the inlet increases. Augmenting the width of the outlet while keeping the gas velocity constant at the outlet requires that the injector have a greater length, that the amount of gas required to travel through the injector is increased, and that the gas is injected with a higher velocity at the inlet. All these constraints cause a higher risk of turbulence and recirculation of the gas upon inlet, less efficiency of the deposition process (longer time required between the injection of successive gas pulses), non-uniform gas distribution, deposition anomalies, and uneven thin films.

Figure 10:
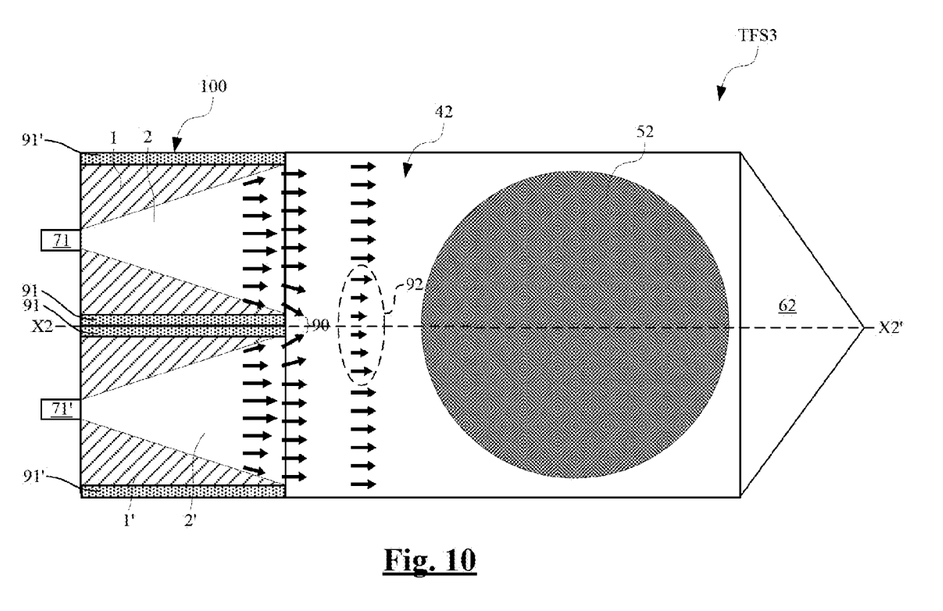
FIG. 10 is a schematic top view of a first embodiment of a thin film deposition system according to a second aspect of the invention.

FIG. 10 is a schematic top cross-sectional view of a thin film deposition system TFS3 according to a second aspect of the invention. The system TFS3 comprises a modular injector 100, a large processing chamber 42 shaped to receive a large substrate 52, and an adapted exhaust device 62.

The modular injector 100 comprises at least two adjacent injectors, here two conventional injectors 1, 1' as described in relation with FIG. 1A. Both injectors are arranged side by side, with lateral walls 91 in contact with each other or separated by a joint. Each injector has an inlet coupled to a gas tube 71, 71', to receive a gas wave (or a gas flow, depending on the process to be implemented), a flow-shaping section 2, 2' having left and right sidewalls that diverge according to a divergence angle, and an outlet for expelling the gas.

The modular injector 100 forms an equivalent large injector having an equivalent large outlet which includes the outlets of the adjacent injectors 1, 1' and expanding the gas over the equivalent large outlet. The modular injector expels a resulting gas wave formed by the juxtaposition of the gas waves expelled by each injectors, that travels through the processing chamber 42 along a propagation axis X2X2'.

Such a parallel arrangement of injectors 1, 1' avoids the drawbacks indicated above, in particular it does not require an increase of the length of the injectors and an increase of the velocity of the gas injected at the inlet, thereby minimizing associated problems such as recirculation and turbulence. In practice, the choice of the number of injectors to use depends on the size of the substrate to be processed. Furthermore, development costs are reduced due to optimization of a single injector that is then used as many times as desired to obtain a modular injector.

In order to ensure the generation of a uniform gas wave upon the outlet of the two or more injectors that form a modular injector, different factors must be taken into consideration, such as proper alignment of the injectors and synchronization of the gas waves for all injectors (timing and flow rate). These factors can be relatively easily addressed. The alignment of the two or more injectors with each other and with the processing chamber can be achieved by any known means, such as alignment pins, rails, etc.

Synchronization of the gas waves can be achieved with a fairly high accuracy by the precise control of gas sources, valves, and gas tubes with nominally identical components for each modular injector. For example, electrically-actuated pneumatic valves allow for the injection of gas pulses with durations as low as 20 ms and with synchronization of several values with an accuracy better than 1 ms.

Another factor that may be taken in consideration is uniformity of the pulse over the equivalent large outlet of the modular injector. Now, referring to FIG. 10, it can be noted that a connection area 90 exists between the injectors, where the two injectors 1, 1' are joined. The connection area 90 is defined as a distance between the adjacent sidewalls 91 of the outlets of the injectors 1, 1'. More generally speaking, in a modular injector comprising more than two injectors, it is defined as the distance between adjacent outlet sidewalls of any two adjacent injectors. Such a connection area is generally equal to two times the thickness of the walls of the injectors that are side by side. It may also include the thickness of any alignment or fastening means that may be arranged between two adjacent injectors.

It can be further noted that since no gas is expelled in the connection area, the gas velocity profile may present a non-uniform region 92 opposite the connection area, along the propagation axis X2X2' of the resulting gas wave. This phenomenon is worsened by the fact that the conventional injectors 1, 1' intrinsically present a non-uniform distribution of the gas upon their outlets, with a lower gas velocity near their sidewalls.

Figure 11:
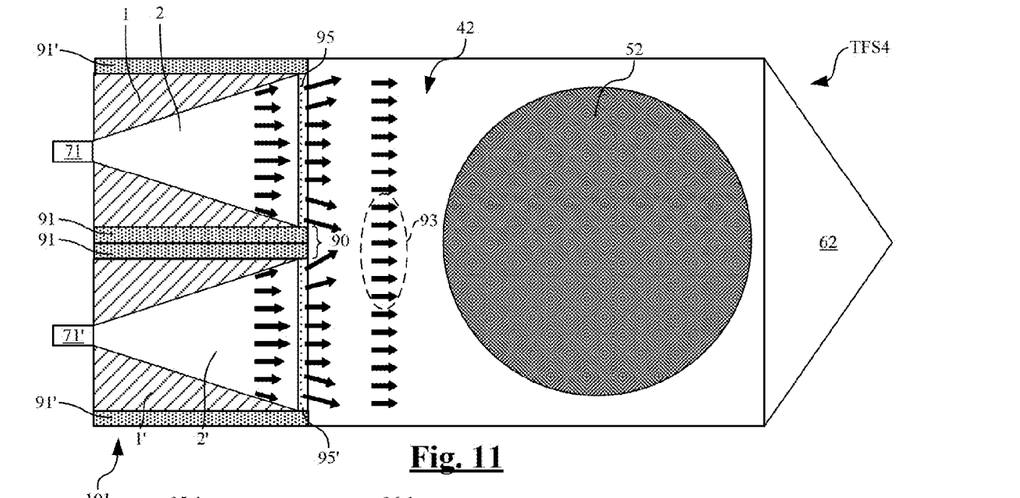
FIG. 11 is a schematic top view of a second embodiment of a thin film deposition system according to the second aspect of the invention.

FIG. 11 is a schematic top cross-sectional view of a thin film deposition system TFS4 according to the second aspect of the invention, which provides a better uniformity of the gas velocity profile in the processing chamber. The system TFS4 is generally similar to system TFS3 and also comprises a modular injector 101 with two injectors 1, 1', the processing chamber 42 and the exhaust device 62.

Each injector 1, 1' further comprises a diffuser plate 95, 95', arranged at its outlet. Each diffuser plate 95, 95' is designed to increase the flow rate of the gas near the adjacent sidewalls of the injectors, to compensate for the lack of gas expulsion in the connection area 90. As a result, the large gas wave in the processing chamber shows a uniform velocity profile at a certain distance from the outlet of the modular injector 101, in a region 93 opposite the connection area.

Figure 12A:
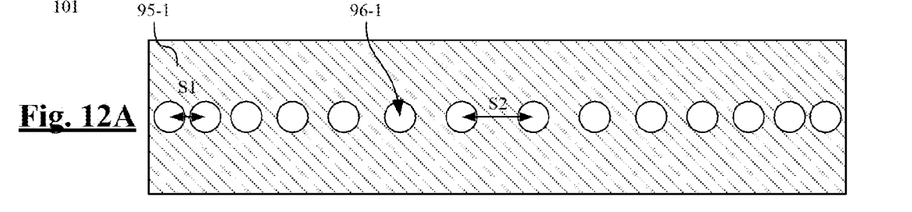
FIGS. 12A and 12B show diffuser plates present in the system of FIG. 11.

FIG. 12A shows an example embodiment 95-1 of the diffuser plates 95, 95'. Diffuser plate 95-1 comprises openings 96-1 with constant diameter and non constant distribution, so that there are more openings near the edges of plate 95-1 corresponding to the sidewalls of the injector, than near the center of the plate. For example, the center-to-center distance between the openings varies from a minimum value S1 at the edges of the plate to a maximum value S2 at the center of the plate, where the opening are wider spaced.

Figure 12B:
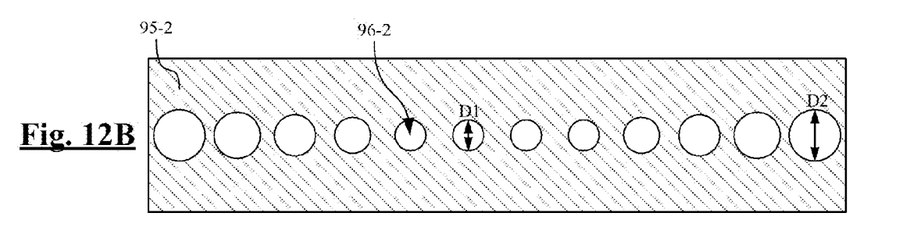

FIG. 12B shows another example embodiment 95-2 of the diffuser plates 95, 95'. Diffuser plate 95-2 comprises openings 96-2 with varying diameters and constant center-to-center distance, arranged so that there are larger openings near the edges of plate 95-2 corresponding to the sidewalls of the injector, than in the center of the plate. For example, the diameter of the openings varies from a minimum value D1 near the center of the plate to a maximum value D2 at the edges of the plate.

A third embodiment of the plates 95, 95', not shown, may comprise variable center-to-center distance between the openings and variable opening diameters.

It is to be noted in FIGS. 12A, 12B that the openings of the diffuser plates 95-1, 95-2 have similar arrangement at right and left edges diffuser plates. This symmetrical arrangement increases the gas flow rate at each side of the outlets of injectors 1, 1', to compensate for both the absence of gas expulsion in the connection area 90 and the presence of non-adjacent lateral walls 91' at each side of the modular injector. Therefore, the equivalent width of the outlet of the modular injector can be considered as the sum of the widths of each outlet, plus the sum of the thicknesses of the adjacent walls 91, plus the sum of the thicknesses of the non adjacent lateral walls 91'. In other embodiments, the openings of the diffuser plates 95-1, 95-2 may have nonsymmetrical arrangement at right and left edges diffuser plates.

Figure 13:
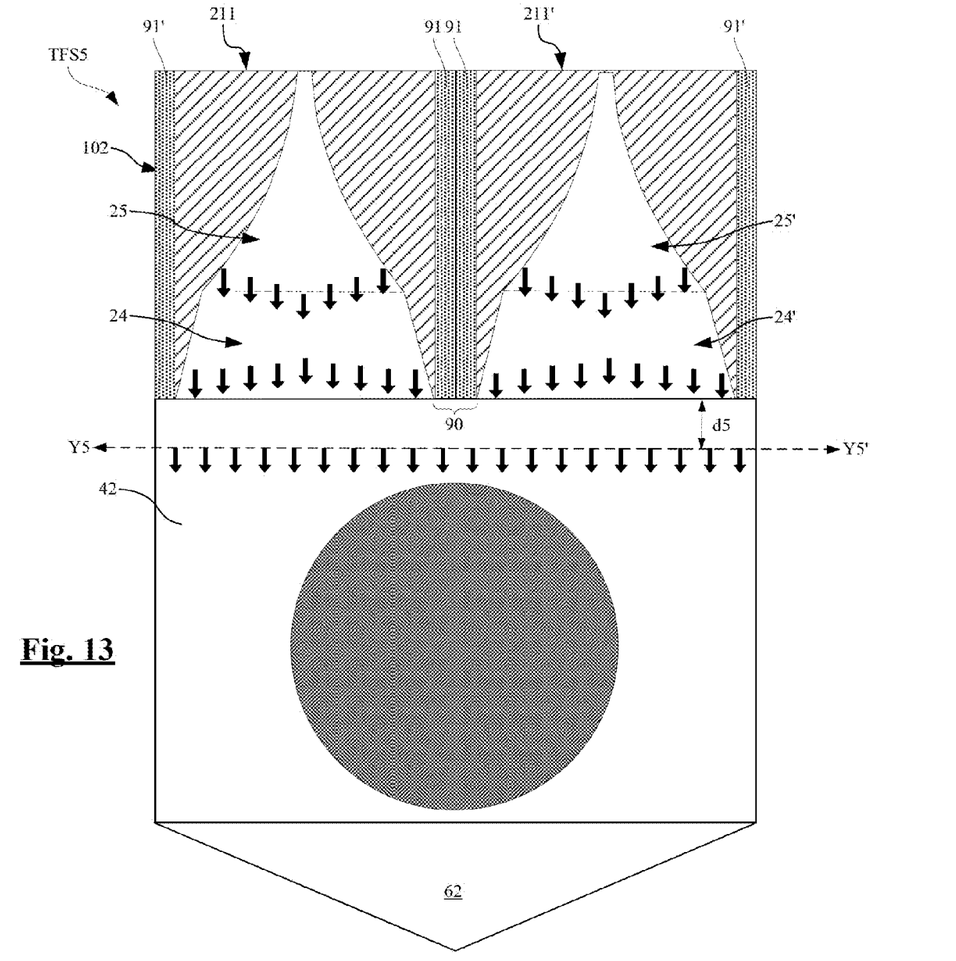
FIG. 13 is a schematic top view of a third embodiment of a thin film deposition system according to the second aspect of the invention.

FIG. 13 is a schematic top cross-sectional view of another embodiment TFS5 of a thin film deposition system according to the second aspect of the invention, which also provides a better uniformity of the gas velocity profile in the processing chamber and compensates the presence of the connection area 90.

The system TFS5 comprises a modular injector 102, the processing chamber 42, the exhaust device 62, and the connection area 90. The modular injector 102 comprises two adjacently arranged injectors 211, 211' that are designed according to the first aspect of the invention, each injector comprising an expansion region 25 and a constriction region 24. Each injector 211 or 211' differs from injector 11 or 11' previously described in that the expansion and constriction regions are configured so that, at the outlet of the injector, the velocity of the gas near the sidewalls is greater than the velocity of the gas near the center of the outlet, which also means that the flow rate of the gas near the sidewalls is greater than the flow rate of the gas near the center of the outlet.

In a nonsymmetrical embodiment of the injector 211, 211', the expansion and constriction regions may be configured so that velocity of the gas is only greater near the sidewall which is adjacent to a sidewall of the other injector.

Figure 14:
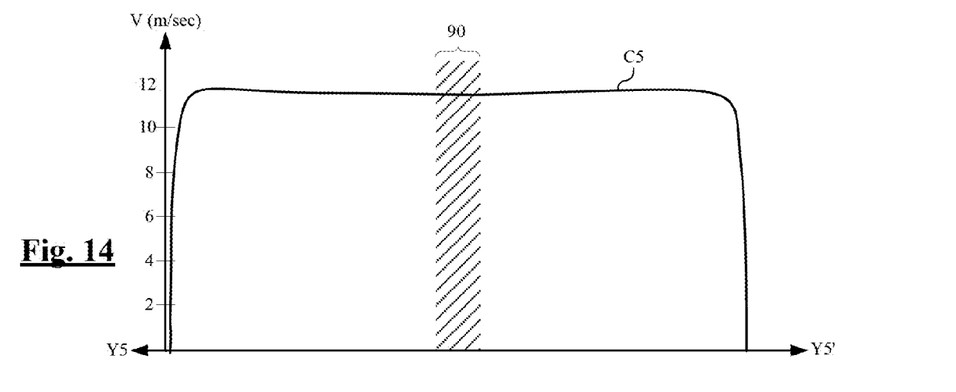
FIG. 14 shows the velocity profile of a gas traveling through the system of FIG. 13.

FIG. 14 shows the profile C5 of the gas velocity V at the outlet of the injectors 211, 211' of FIG. 13. The gas velocity is measured along an axis Y5Y5' which is perpendicular to the propagation axis of the large gas wave, and is located at a certain distance d5 from the outlet of the modular injector, for example at 5 mm from the modular injector. The velocity profile C5 is substantially constant and presents a variation of less than 10% between maximum and minimum velocities over at least 90% of the width of the equivalent large outlet of the modular injector.

A modular injector is susceptible of various other embodiments and applications. In one embodiment, several modular injectors, each comprising N parallel injectors, are arranged in a thin film deposition system comprising a conveyer belt upon which substrates are arranged (in-line system) or a continuous roll of a flexible substrate (roll-to-roll system). Each time a substrate or a part of the continuous substrate is in front of the outlet of a modular injector, one or more pulses of one or more gases are expelled onto the substrate. Such a system allows for the continuous deposition of thin films on a series of substrates, resulting in higher throughput.

Figure 15A:
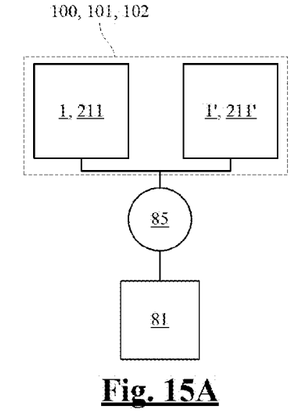
FIGS. 15A, 15B, 15C show different gas circuit configurations of a thin film deposition system according to the invention.
Figure 15B:
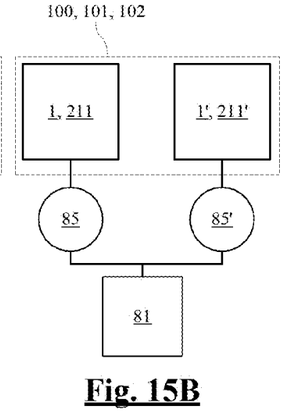
Figure 15C:
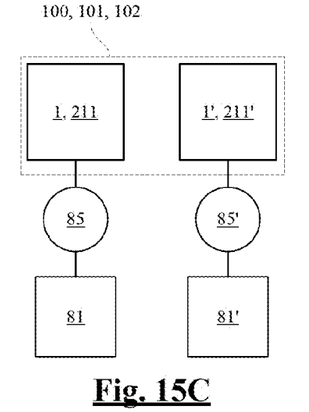

FIGS. 15A, 15B, 15C show different arrangements for supplying a modular injector 100, 101, 102 with gas. As it is desired to obtain a uniform gas profile at the outlet of the modular injector, it is important to precisely synchronize the injection of the gas into each injector, in particular when a pulsed process is implemented. In FIG. 15A, a single gas source 81 is linked to the injectors 1, 1' or 211, 211' through a single valve 85. In FIG. 15B, a single gas source 81 is linked to the injectors 1, 1' through two valves 85, 85', one per injector. In FIG. 15C, one first gas source 81 is linked to the first injector 1 or 211 through one first valve 85. One second gas source 81' providing the same gas as the first gas source 81, is linked to the second injector 1' or 211' through one second valve 85'. It will be clear to the skilled person that these arrangements are applicable to modular injectors comprising N parallel injectors; in particular, N parallel injectors may be driven by a single valve.

Furthermore, despite that the present invention has been described above in connection with applications relating to thin film deposition techniques, it will be clear to the skilled person that embodiments of an injector or embodiments of a modular injector according to the invention may be used for other purposes, in different applications where it is required to inject a gas in a processing chamber, such as etching, diffusion, and the like.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An injector for injecting a gas into a processing chamber, the injector comprising:
an inlet for receiving a gas wave or a gas flow,
a flow-shaping section for expanding the gas in a direction perpendicular to a propagation axis of the gas,
an outlet for expelling the gas,
wherein the flow-shaping section has first and second sidewalls which diverge according to a divergence angle relative to the propagation axis of the gas, and
wherein the flow-shaping section is configured to slow down a velocity of the gas near a center of the flow-shaping section, relative to a velocity of the gas near at least one of the sidewalls, and comprises:
a first expansion region where at least one of the sidewalls diverges according to a first divergence angle, and a second expansion region where at least one of the sidewalls diverges according to a second divergence angle, smaller than the first divergence angle, and
the second expansion region includes a constriction region having a first height near the center of the flow-shaping section and a second height near at least one of the sidewalls of the flow-shaping section, the first height being less than the second height.

2. The injector according to claim 1, wherein the first expansion region has a constant height followed by the constriction region.

3. The injector according to claim 2, wherein the constriction region is followed by a further expansion region having a constant height less than the first height of the constriction region.

4. The injector according to claim 1, wherein the first divergence angle varies and presents a largest value at an end of the first region, and the second divergence angle is constant and smaller than the largest value of the first divergence angle.

5. The injector according to claim 1, wherein the flow-shaping section and constriction region are shaped so that the gas expelled through the outlet has a velocity profile showing a variation of less than 10% between maximum and minimum velocities, over at least 90% of the width of the outlet.

6. The injector according to claim 1, having a curved flow-shaping section.

7. A system comprising:
a processing chamber,
at least one injector according to claim 1, the outlet of which opens into the processing chamber, and
at least one gas source coupled to the inlet of the injector.

8. The system according to claim 7, comprising two superposed injectors arranged one above the other and having a common outlet.

9. The system according to claim 7, comprising at least two adjacent injectors forming an equivalent large injector having an equivalent large outlet including the outlets of the adjacent injectors and expanding the gas over the equivalent large outlet.

10. A method for injecting a gas wave or a gas flow into a processing chamber, the method comprising:
expanding the gas in a direction perpendicular to a propagation axis of the gas with an injector comprising an inlet, a flow-shaping section, and an outlet for expelling the gas, and
then injecting the gas into the processing chamber,
wherein expanding the gas comprises slowing down a velocity of the gas near a center of the flow-shaping section of the injector relative to a velocity of the gas near at least one sidewall of the flow-shaping section to control the velocity profile of the gas at the outlet of the injector, and
wherein expanding the gas includes:
providing in the injector at least one constriction region having a first height near the center of the flow-shaping section and a second height near the at least one sidewall of the flow-shaping section, the first height being less than the second height,
diverging the at least one sidewall in a first region of the flow-shaping section according to a first divergence angle, and
diverging the at least one sidewall in a second region of the flow-shaping section including the constriction region, according to a second divergence angle smaller than the first divergence angle.

11. The method according to claim 10, comprising varying the first divergence angle so that it presents a largest value at an end of the first region, and keeping the second divergence angle constant and smaller than the largest value of the first divergence angle.

12. The method according to claim 10, wherein the slowing down the velocity of the gas near the center of the flow-shaping section is such that the gas injected into the processing chamber has a velocity profile showing a variation of less than 10% between maximum and minimum velocities, over at least 90% of the width of the outlet.

* * * * *